United States Patent [19]

Engel

[11] Patent Number: 5,396,244

[45] Date of Patent: Mar. 7, 1995

[54] DIGITAL-TO-ANALOG CONVERTER

[75] Inventor: Roza Engel, Eindhoven, Netherlands

[73] Assignee: U.S. Philips Corporation, New York, N.Y.

[21] Appl. No.: 149,489

[22] Filed: Nov. 9, 1993

[30] Foreign Application Priority Data

Nov. 9, 1992 [EP] European Pat. Off. ............ 92203425

[51] Int. Cl.⁶ ............................................. H03M 3/00
[52] U.S. Cl. ..................................... 341/143; 341/144
[58] Field of Search ............... 341/143, 144, 152, 118; 375/28

[56] References Cited

U.S. PATENT DOCUMENTS 5,245,345  9/1993  Kohdaka et al. .................... 341/152

OTHER PUBLICATIONS

Naus et al., "A CMOS Stereo 16-Bit D/A Converter for Digital Audio", IEEE Journal of Solid-State Circuits, vol. SC-22, No. 3, Jun. 1987, pp. 390-395.

Kikkert et al., "Asynchronous Delta Sigma Modulation", Proceedings of the IREE of Australia, vol. 36, Apr. 1975, pp. 83-88.

Primary Examiner—Brian K. Young
Attorney, Agent, or Firm—Bernard Franzblau

[57] ABSTRACT

A digital-to-analog converter comprises a sigma-delta modulator for generating a 1-bit digital signal (D3) modulated synchronously with a clock signal (NFS) in response to a digital input signal (D2). This modulator is followed by an asynchronous analog sigma-delta modulator for generating a bivalent asynchronously modulated signal (D4) in response to the synchronously modulated digital signal (D3). The information in the digital signal (D3) from the sigma-delta modulator resides in signal transitions which can appear exclusively at discrete instants defined by the clock signal. The information in the asynchronously modulated signal (D4) from the asynchronous sigma-delta modulator is contained in an analog variation of the duty cycle. This means that the signal transitions of the asynchronously modulated signal (D4) are not tied to a fixed pattern of discrete instants but that all the intervening instants are also available. As a result of the freedom of the positions of the signal transitions, the frequency spectrum of the asynchronously modulated signal (D4) has a substantially smaller width than the frequency spectrum of the synchronously modulated digital signal (D3) from the sigma-delta modulator. This enables an interface to a further signal processing device to be simplified.

10 Claims, 2 Drawing Sheets

DIGITAL-TO-ANALOG CONVERTER

BACKGROUND OF THE INVENTION

This invention relates to a digital-to-analog converter comprising a sigma-delta modulator for generating a 1-bit digital signal modulated synchronously with a clock signal in response to a digital input signal, and output means for supplying an output signal in response to the synchronously modulated digital signal.

Such a DAC is known from, inter alia, an article by Peter J. A. Naus et al., "A CMOS Stereo 16-bit D/A Converter for Digital Audio", IEEE Journal of Solid-State Circuits, Vol. SC-22, No. 3, June 1987, pp. 390–395. The D/A conversion method described in said article is known by the name of "Bit-Stream" conversion. A 16-bit pulse-code modulated digital audio signal of comparatively low clock frequency is oversampled by means of digital interpolation filters until a 17-bit digital audio signal of 256 times the clock frequency is obtained. This 17-bit signal is applied to a second-order sigma-delta modulator (SDM), which on account of its properties is often referred to as a noise shaper. The SDM converts the 17-bit digital signal into a 1-bit digital signal. The advantage of this method is that for the actual digital-to-analog conversion only comparatively simple analog filter means are required, which in the cited article comprise a 1-bit DAC and a first-order low-pass filter. Such a conversion method is not only attractive in the case of audio signals but in principle offers just as many advantages in the case of video signals. However, the clock frequency of an oversampled digital video signal is very high and can be a few hundreds of MHz. As a result of this, the interface between the 1-bit digital signal from the SDM and the analog filter means will pose a difficult technical problem. This interface is needed if the digital and the analog signal processing are effected in different integrated circuits, for example, to preclude interaction or because the digital and the analog pans are manufactured in different technologies.

SUMMARY OF THE INVENTION

It is an object of the invention to mitigate this interface problem. To achieve this, in accordance with the invention, the DAC of the type defined in the opening paragraph is characterized in that the digital-to-analog converter further comprises an asynchronous sigma-delta modulator for generating a bivalent asynchronously modulated signal in response to the synchronously modulated digital signal from the sigma-delta modulator and for supplying the asynchronously modulated signal to the output means.

An asynchronous sigma-delta modulator (ASDM) converts an analog signal into a squarewave whose duty cycle is modulated linearly with the instantaneous value of the analog signal. The invention is based on the recognition of the fact that the properties of an ASDM can also be utilized if, instead of an analog signal, the oversampled 1-bit digital signal from an SDM is applied to it. Indeed, the low-frequency component of the spectrum of the SDM signal is equivalent to an analog signal. The other frequency components of the spectrum are rejected in the loop filter of the ASDM.

The information in the digital signal from the SDM resides in signal transitions which can occur exclusively at discrete instants determined by the clock frequency of the SDM. The information of an ASDM signal is contained in the analog variation of the duty cycle. This means that the signal transitions of the ASDM signal are not restricted to a fixed pattern of discrete instants but that all of the intervening instants are also available. As a result of this freedom of the positions of the signal transitions, the frequency spectrum of the ASDM signal has a substantially smaller width than the frequency spectrum of the SDM signal.

Asynchronous sigma-delta modulators are known per se. Reference is made to an article by C. J. Kikkert et al., "Asynchronous Delta Sigma Modulation", Proceedings of the IREE of Australia, Vol. 36, April 1975, pp. 83–88, which comprehensively describes the principle and the theory.

BRIEF DESCRIPTION OF THE DRAWINGS

The above and other aspects of the invention will be described and elucidated with reference to the accompanying drawings, in which.

DETAILED DESCRIPTION OF THE PREFERRED EMBODIMENTS OF THE INVENTION

Figure 1:
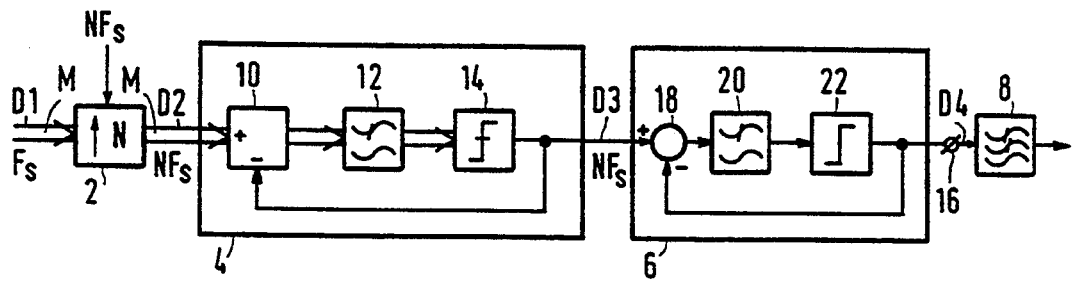
FIG. 1 shows a block diagram of a digital-to-analog converter in accordance with the invention.
Figure 2:
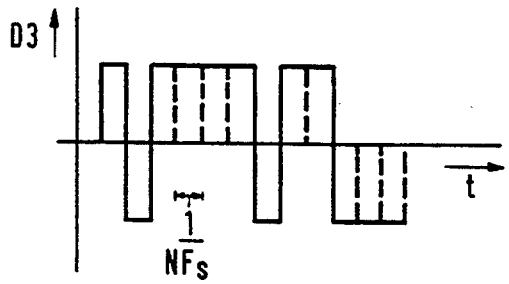
FIG. 2 shows the output signal of a clocked sigma-delta modulator.

FIG. 1 shows a digital-to-analog converter (DAC) comprising a series arrangement, of a digital upsampling filter 2, a for example, digital sigma-delta modulator (SDM) 4, an analog asynchronous sigma-delta modulator (ASDM) 6, and an analog low-pass filter 8. An M-bit digital signal D1 having a low clock frequency $F_S$ is N times oversampled in the upsampling filter 2, yielding an M-bit digital signal D2 having a high clock frequency $NF_S$. Subsequently, the SDM 4 converts the signal D2 into a 1-bit digital SDM signal D3, whose signal waveform is shown in FIG. 2. The SDM signal D3, commonly referred to as a "bit-stream" signal, changes its value at instants which are determined by the high clock $NF_S$ from the SDM 4. The upsampling filter 2 and the SDM 4 may be of conventional types. The SDM 4 may comprise, in known manner, a digital differential stage 10, a digital low-pass loop filter 12, and a digital quantizer 14 which reduces the M-bit signal D2 to the 1-bit SDM signal D3 and whose output signal D3 is subtracted from the input signal D2. The purpose and the function of the upsampling filter 2 and the SDM 4 are known, inter alia, from the aforementioned article by Peter J. A. Naus et al. The result is a bit-stream SDM signal D3 whose low-frequency component is substantially identical to the analog signal information in the digital signal D1 and which can be recovered by means of a comparatively simple low-pass filter 8.

The signal transitions in the SDM signal D3 appear with the high clock frequency $NF_S$, which can be very high, a few hundreds of MHz, in digital video signal systems, so that the spectrum of the SDM signal D3 is very broad. The interface 16 between the digital and the analog part of the signal path is then technically difficult, inter alia, owing to the limited dynamic range, the signal distortion and the dissipation which occur at the very high frequencies of the SDM signal D3. In order to cope with these limitations, the invention provides an additional signal transformation by means of the ASDM 6. The ASDM 6 comprises an analog differential stage 18, an analog low-pass filter 20 and an analog comparator 22, whose output signal D4 is subtracted from the input signal D3 in the differential stage 18.

Figure 3:
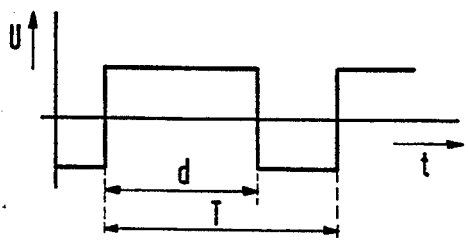
FIG. 3 shows a signal waveform to illustrate the operation of an asynchronous sigma-delta modulator.
Figure 4:
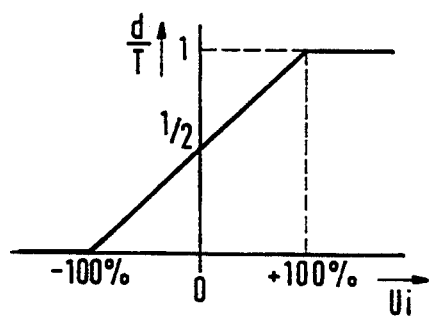
FIG. 4 and FIG. 5 show some characteristic curves to illustrate the operation of an asynchronous sigma-delta modulator.
Figure 5:
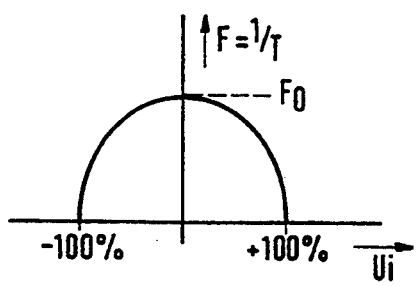

The principle and the theory of an ASDM are known per se from, inter alia, the afore-mentioned article by C. J. Kikkert et al. An ASDM converts an analog signal Ui into a squarewave having a period T (see FIG. 3) whose duty cycle d/T is a linear function of the instantaneous value of the analog input signal Ui (see FIG. 4). The frequency $F=1/T$ of the squarewave also depends on the input signal Ui and for slow variations of Ui it complies with a square-law function $F=F_0(1-Ui^2)$, where $F_0$ is the centre frequency for $Ui=0$ (see FIG. 5). The spectrum of the squarewave comprises a fundamental component identical to the spectrum of the analog input signal Ui and a plurality of harmonics with sidebands filled with Bessel components of the fundamental. The fundamental can be recovered from the squarewave by means of a simple low-pass filter. An ASDM is self-oscillating by providing a hysteresis in the comparator, a delay in the feedback path, or by a combination of these. The same effect can also be achieved by means of a higher order low-pass filter. The centre frequency $F_0$ is dictated by the design of the ASDM and should be high enough to preclude distortion. A clock frequency $F_0$ of twice the bandwidth of the analog input signal Ui is adequate.

Figure 6:
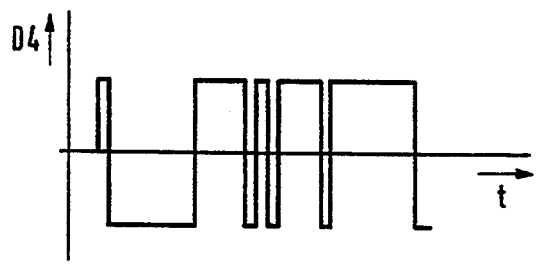
FIG. 6 shows the output signal of an asynchronous sigma-delta modulator.

In the DAC shown in FIG. 1 the bit-stream SDM signal D3 functions as the analog input signal Ui for the ASDM 6, whose output signal D4 is the squarewave shown in FIG. 6. The time axis in FIG. 6 bears no relation to that shown in FIG. 2 and the waveform shown merely serves to illustrate the fact that the transitions (zero crossings) in the ASDM signal D4 can occur at any instant. This is in contradistinction to the transitions of the SDM signal D3 in FIG. 2, which can occur only at discrete instants. As a result of this, the spectrum of the ASDM signal D4 has a substantially smaller width than the spectrum of the SDM signal D3.

It has been found that the waveform of the ASDM signal D4 does not contain any frequencies above 40 MHz when the input was an SDM signal D3 having a clock frequency of 200 MHz modulated with a low-frequency sinewave of 1 MHz. The 1 MHz low-frequency component of the ASDM signal D4 then had a signal distortion hardly in excess of the 1 MHz low-frequency component of the SDM signal D3. The low-pass filter 20 of the ASDM 6 was a third-order filter having poles at 1, 2 and 30 MHz and a zero at 15 MHz. The centre frequency $F_0$ was approximately 30 MHz. This yields a substantial reduction in bandwidth of the signal to be applied to the analog low-pass filter 8 via the interface 16. It is now possible to use a simple CMOS inverter having a power efficiency of almost 100% and having a very low inherent signal distortion.

Figure 7:
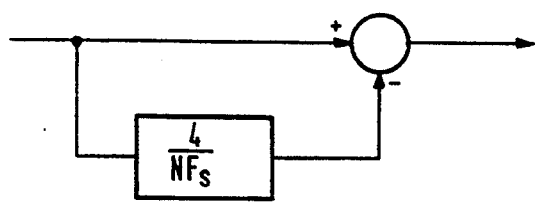
FIG. 7 shows a filter for use in a digital-to-analog converter in accordance with the invention.

It may also be advantageous to provide additional suppression of the quantization noise in the SDM signal D3 outside the base band of the modulating signal. A simple notch falter arranged between the SDM 4 and the ASDM 6, as shown FIG. 7, is adequate.

Figure 8:
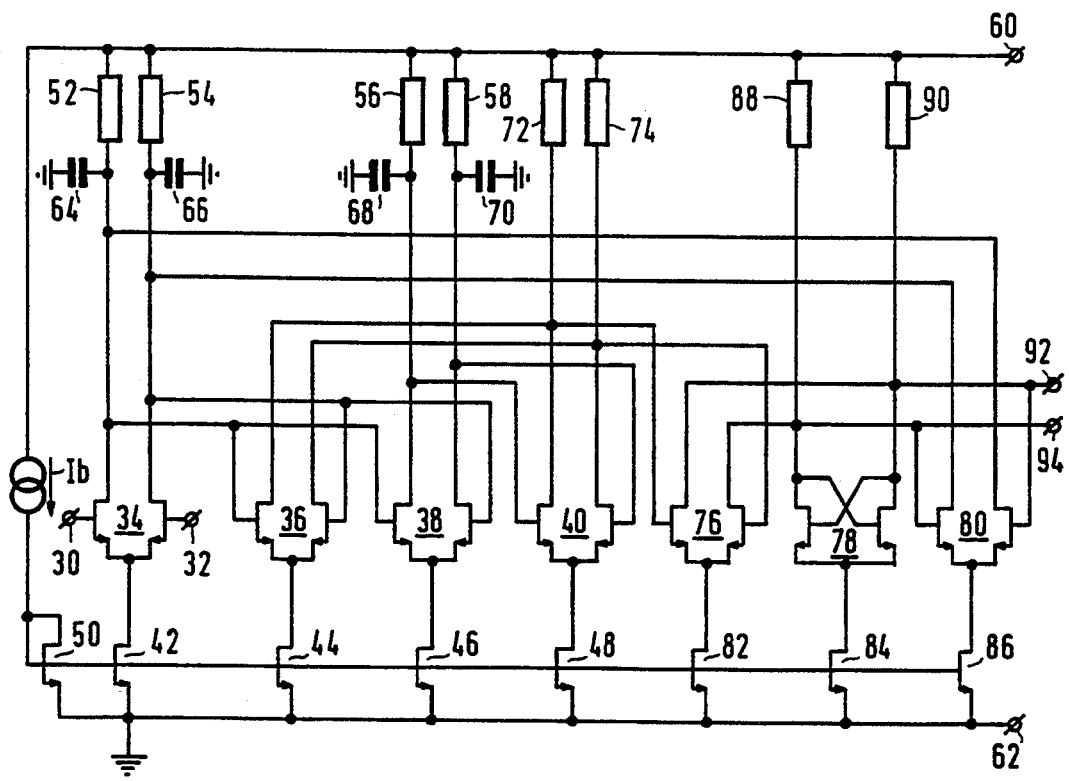
FIG. 8 shows a circuit diagram of an asynchronous sigma-delta modulator for use in a digital-to-analog converter in accordance with the invention.

FIG. 8 shows the circuit diagram of an ASDM 6 in MOS technology. The balanced input signal is applied to the input terminals 30 and 32, which are connected to the gates of a differential pair 34 which in conjunction with the differential pairs 36, 38 and 40 constitutes an active second-order low-pass falter. The sources of the differential pairs 34, 36, 38 and 40 are connected to a negative supply terminal 62 via respective current-source transistors 42, 44, 46 and 48, which form a current mirror with the diode-connected transistor 50 through which a bias current Ib flows. The drains of the transistors of the differential pairs 34 and 38 are connected to a positive supply terminal 60 via respective resistors 52, 54, 56 and 58 and to the negative supply terminal 62 via respective capacitors 64, 66, 68 and 70. This provides a second-order low-pass filter function. The resistors and capacitors may alternatively be constructed as MOS transistors, a resistor being formed by a diode-connected transistor and a capacitor being formed by the gate capacitance of a transistor whose source and drain are connected to a reference voltage. The drains of the differential pair 34 are connected to the gates of the differential pair 38 and also to the gates of the differential pair 36. The drains of the differential pair 38 are connected to the gates of the differential pair 40. The drains of the differential pairs 36 and 40 have common resistors 72 and 74.

The differential pairs 76, 78 and 80, which are supplied with current by respective current-source transistors 82, 84 and 86, in a way similar to the aforementioned differential pairs, form a comparator. The gates of the differential pair 76 are connected to the drains of the differential pair 40, and the drains of the differential pair 76 are connected to the gates of the differential pair 78, which is arranged as a flip-flop and whose drains are connected to the positive supply terminal 60 via resistors 88 and 90 to form a balanced output signal, which is available on output terminals 92 and 94 connected to the drains. Feedback is applied via the differential pair 80, which has its gates connected to the output terminals 92 and 94 and its drains to the drains of the differential pair 34.

I claim:

1. A digital-to-analog converter comprising: a sigma-delta modulator for generating a 1-bit digital signal (D3) modulated synchronously with a clock signal ($NF_S$) in response to a digital input signal (D2), output means for supplying an output signal in response to the synchronously modulated digital signal (D3), and wherein the digital-to-analog converter further comprises an asynchronous sigma-delta modulator for generating a bivalent asynchronously modulated signal (D4) in response to the synchronously modulated digital signal (D3) from the sigma-delta modulator and for supplying the asynchronously modulated signal (D4) to the output means.

2. A digital-to-analog converter comprising:
   a sigma-delta modulator having input means for receiving a digital input signal and operative to generate at its output a 1-bit digital signal modulated synchronously with a clock signal in response to said digital input signal, an asynchronous sigma-delta modulator having input means coupled to the output of said sigma-delta modulator to receive said 1-bit synchronously modulated digital signal and being operative in response to the 1-bit synchronously modulated digital signal to generate a bivalent asynchronously modulated signal at its output, an analog output filter means, and an interface circuit coupled between the output of the asynchronous sigma-delta modulator and an input of the analog output filter means.

3. The digital-to-analog converter as claimed in claim 2 further comprising:

an input terminal for an M-bit digital signal (D1) having a clock frequency $F_s$, and an upsampling filter coupled between said input terminal and said input means of the sigma-delta modulator and having a sampling input for a clock frequency signal $NF_s$ whereby the upsampling filter produces at its output an M-bit digital signal (D2) having a clock frequency $NF_s$, where N is a number greater than 1.

4. The digital-to-analog converter as claimed in claim 2, wherein said interface circuit comprises an inverter and said analog output filter means comprises a low pass filter.

5. The digital-to-analog converter as claimed in claim 2 wherein said asynchronous sigma-delta modulator converts an input digital signal (D3) having a wide frequency spectrum into an output digital signal (D4) having a much narrower frequency spectrum.

6. The digital-to-analog converter as claimed in claim 5 wherein the asynchronous sigma-delta modulator output digital signal (D4) does not include any frequencies above 40 MHz when the input digital signal (D3) comprises a clock frequency of 200 MHz modulated with a sine wave of 1 MHz.

7. The digital-to-analog converter as claimed in claim 2 wherein:

the sigma-delta modulator comprises a cascade connection of a digital differential circuit coupled to the input means of the sigma-delta modulator, a digital low pass filter, and a digital quantizer having an output coupled to the output of the sigma-delta modulator, and a feedback circuit coupled between the output of the digital quantizer and an input of the digital differential circuit, and the asynchronous sigma-delta modulator comprises a cascade connection of an analog differential circuit coupled to the input means of the asynchronous sigma-delta modulator, an analog low pass filter, and an analog comparator having an output coupled to the output of the asynchronous sigma-delta modulator, and a feedback circuit coupled between the output of the analog comparator and an input of the analog differential circuit.

8. The digital-to-analog converter as claimed in claim 2 wherein the sigma-delta modulator comprises a first integrated circuit and the analog output filter means comprises a second integrated circuit.

9. The digital-to-analog converter as claimed in claim 2 further comprising a notch filter coupled between the output of the sigma-delta modulator and the input means of the asynchronous sigma-delta modulator.

10. In a digital video system, a digital-to-analog converter comprising:

a sigma-delta modulator having input means for receiving a video frequency digital input signal and operative to generate at its output a 1-bit digital signal modulated synchronously with a clock signal at a frequency that is N times the video frequency in response to said digital input signal, an asynchronous sigma-delta modulator having input means coupled to the output of said sigma-delta modulator to receive said 1-bit synchronously modulated digital signal and being operative in response to the 1-bit synchronously modulated digital signal to generate a bivalent asynchronously modulated signal at its output, an analog output filter means, and an interface circuit coupled between the output of the asychronous sigma-delta modulator and an input of the analog output filter means.

* * * * *